(12) United States Patent
Wu et al.

(10) Patent No.: US 7,698,662 B1
(45) Date of Patent: Apr. 13, 2010

(54) SYSTEM AND METHOD FOR PROXIED EVALUATION OF PCELLS

(75) Inventors: Felix Sun-Tsyr Wu, San Jose, CA (US); Edwin Simon Petrus, Piedmont, CA (US); Lyndon Charles Lim, San Jose, CA (US)

(73) Assignee: Ciranova, Inc., Santa Clara, CA (US)

( * ) Notice: Subject to any disclaimer, the term of this patent is extended or adjusted under 35 U.S.C. 154(b) by 426 days.

(21) Appl. No.: 11/490,678

(22) Filed: Jul. 21, 2006

(51) Int. Cl.
*G06F 17/50* (2006.01)

(52) U.S. Cl. .............................................. 716/1; 716/18

(58) Field of Classification Search .................... 716/18, 716/1
See application file for complete search history.

(56) References Cited

U.S. PATENT DOCUMENTS

| | | | |
|---|---|---|---|
| 5,724,588 A * | 3/1998 | Hill et al. ..................... | 719/328 |
| 5,890,155 A * | 3/1999 | Steinman et al. ............... | 707/9 |
| 5,920,486 A * | 7/1999 | Beahm et al. ................. | 716/10 |
| 6,301,692 B1 | 10/2001 | Kumashiro et al. | |
| 6,490,708 B2 | 12/2002 | Cohn et al. | |
| 6,691,290 B1 | 2/2004 | Wu | |
| 7,117,469 B1 | 10/2006 | Dahl | |
| 7,136,268 B2 * | 11/2006 | Stricker et al. ................ | 361/56 |
| 7,293,247 B1 * | 11/2007 | Newton et al. ................. | 716/2 |
| 7,296,248 B2 * | 11/2007 | Perez et al. .................... | 716/3 |
| 7,343,570 B2 | 3/2008 | Bowers et al. | |
| 7,343,581 B2 | 3/2008 | Becker | |
| 7,356,784 B1 * | 4/2008 | Dengi et al. ................... | 716/2 |
| 7,461,366 B2 * | 12/2008 | Gaul ............................ | 716/17 |
| 7,506,277 B1 * | 3/2009 | Arora et al. .................... | 716/1 |
| 7,587,694 B1 * | 9/2009 | Henrickson et al. ........... | 716/10 |
| 2003/0005400 A1 * | 1/2003 | Karniewicz .................... | 716/8 |
| 2004/0268284 A1 * | 12/2004 | Perez et al. .................... | 716/11 |
| 2006/0075371 A1 * | 4/2006 | Kamat ........................... | 716/11 |
| 2006/0080644 A1 * | 4/2006 | Fuhrer et al. .................. | 717/137 |
| 2006/0143589 A1 * | 6/2006 | Horng et al. ................... | 716/19 |
| 2007/0101306 A1 * | 5/2007 | Bowers et al. ................. | 716/10 |
| 2007/0118825 A1 * | 5/2007 | Gaul ............................. | 716/10 |

(Continued)

OTHER PUBLICATIONS

Assessment of the OpenAccess Standard: Insights on the new EDA Industry Standard from Hewlett-Packard, a Beta Partner and Contributing Developer. Blanchard, Terry. Proceedings of the Fourth International Symposium on Quality Electronic Design, 2003. 0-7695-1881-8/03.*

(Continued)

*Primary Examiner*—Jack Chiang
*Assistant Examiner*—Suchin Parihar
(74) *Attorney, Agent, or Firm*—Carr & Ferrell LLP

(57) ABSTRACT

Systems and methods of laying out integrated circuits are disclosed. During the layout stage of an integrated circuit device, a fixed, physical geometry is created of the parameterized cells (PCells) included in the integrated circuit schematic. The systems include a proxy engine configured to save to cache the geometries created during the layout stage such that the geometries need not be recomputed when the design is opened after a save to disk operation, during which geometries may otherwise be destroyed. The proxy engine may further be configured to delegate requests for the creation of geometries to other components of the integrated circuit design system. In addition, the proxy engine may be configured to perform customized evaluations of PCells, other than or in addition to caching and delegation.

20 Claims, 5 Drawing Sheets

U.S. PATENT DOCUMENTS

| | | | |
|---|---|---|---|
| 2007/0266445 A1* | 11/2007 | Ferguson et al. | 726/28 |
| 2007/0268731 A1* | 11/2007 | Weiland et al. | 365/51 |
| 2009/0007031 A1* | 1/2009 | Ginetti et al. | 716/4 |
| 2009/0064061 A1* | 3/2009 | Gernhoefer et al. | 716/2 |
| 2009/0172624 A1* | 7/2009 | Lamant | 716/9 |

OTHER PUBLICATIONS

Balasa, F. & Maruvada, S.C., "Using Non-slicing Topological Representations for Analog Placement," IEICE Trans. Fundamentals, Nov. 2001, pp. 2785-2792, vol. E84-A.

Bourguet, V., De Lamarre L., & Louërat, M.-M., "A Layout-Educated Analog Design Flow," University of Paris, VI, LIO6-ASIM Laboratory, Paris, France.

Nakatake, S., Fujiyoshi, K., Murata, H, & Kajitani, Y., "Module Packing Based on the BSG-Structure and IC Layout Applications," IEEE Transactions on Computer-Aided Design of Integrated Circuits and Systems, Jun. 1998, pp. 519-530, vol. 17 No. 6.

Tuong, P., Louërat, M.-M., Greiner, A., "Managing the Shape Function of Analog Devices in a Slicing Tree Floorplan," Pierre et Marie Curie University, France.

Yamanouchi, T., Tamakashi, K., & Kambe, T., "Hybrid Floorplanning Based on Partial Clustering and Module Restructuring," International Conference on Computer Aided Design Proceedings of the 1996 IEEE/ACM International Conference on Computer-Aided Design, California.

Jingnan, Xu et al., "A SKILL(TM)-based Library for Retargetable Embedded Analog Cores", IEEE Proceedings of Design, Automation, and Test in Europe (Date), 2001, 2 pages.

Xu, J.N., et al., "Reusability Methodology of IC Layout—Part II, A Fully Skill-based pCell Design And Layout Direct Retargeting Tool", IEEE Proceedings of Design, Automation,and Test in Europe (Date), 2001, 6 pages.

Cadence Design Systems, Inc., "How to write a Pcell Evaluator Plug-in" 2006, 4 pages.

Mueller, Andreas, "OpenAccess Adoption at Infineon Technologies AG", Infineon Technologies AG, Munich, Germany, Mar. 2005, 11 pages.

Mueller, Andreas and Juergen Schattke, "Adapting C++ based PCells to OpenAccess", Proceedings of CDNLive! Silicon Valley 2005, 6 pages.

Cadence Product Document on "Virtuoso(R) Parameterized Cell Reference", Aug. 2004, 274 pages

* cited by examiner

SYSTEM AND METHOD FOR PROXIED EVALUATION OF PCELLS

BACKGROUND

1. Field of the Invention

The present invention relates generally to integrated circuit (IC) devices, and more particularly to IC device design.

2. Related Art

A process of designing an IC device comprises multiple steps. Building blocks of the IC device under design are typically represented by parameterized cells (PCells). During a schematic (netlist) stage, the PCell is a symbolic representation of an electrical characteristic. During a layout stage, a user application generates a request to evaluate the PCell by passing parameter values and identity of the PCell desired. The request results in a generation of an instantiation of a physical, fixed structure of the PCell. This structure is referred to as design data and is compatible with an electronic design automation (EDA) vendor's database.

Due to the proprietary nature of a vendor's database and programming language, an IC design becomes locked into a particular vendor's tool chain. For example, a designer is unable to use a schematic application from one vendor and a layout application from a different vendor. Although at least one EDA vendor has standardized its database into a nonproprietary format, its programming language remains proprietary. Thus, intellectual property of the user's IC design becomes programmed into a particular vendor's programming language.

During the layout stage, the design data is stored in memory. When the layout is saved to disk, for all the PCell instantiations created, only the parameter values and a reference to the PCell are saved. The design data (i.e., geometries) generated by the PCell instantiations are destroyed. When the layout is opened again, the geometries need to be recreated. Disadvantageously, this process can take a substantial amount of time.

As a further disadvantage, delivering the IC design to a third party comprises delivering scripts for original PCells, into which the user's intellectual property has been programmed. The delivery of the scripts is necessary also for the third party, such as a foundry, which need only validate the IC design and not modify it. Additionally, the third party still requires a license to the EDA vendor's tool in order to open the layout and recreate the geometries.

As additional and more sophisticated EDA tools become available, there is a need for improved systems and methods for designing integrated circuits in terms of increased standardization, improved cross-vendor portability and intellectual property protection, and reduced computational resources required to recompute geometries.

SUMMARY

Embodiments of the present invention provide systems and methods for laying out integrated circuits. In exemplary embodiments, the systems comprise a wrapping module configured to transform an original PCell into a wrapped PCell by adding data to the original PCell, and a proxy engine configured to receive requests for evaluation of PCells from a user application. The proxy engine is further configured to evaluate the PCell in a customized manner depending on the nature of the PCell wrapping. In some embodiments, the customized evaluation comprises storing evaluation results to a client cache. In other embodiments, the customized evaluation comprises delegating the request for evaluation to another component of the integrated circuit design system, for example, to a server-based component.

Additionally, the proxy engine may be configured to determine whether an evaluation result already exists, for example, in a cache. If the evaluation result does not exist, the proxy engine causes the evaluation results to be generated.

Some embodiments of the present invention comprise PCell wrappings that cause the evaluation results to be generated in a recursive manner. For example, recursive evaluation occurs in embodiments comprising multiple levels of delegation of the evaluation request.

DETAILED DESCRIPTION OF EXEMPLARY EMBODIMENTS

Detailed descriptions of exemplary embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ embodiments of the present invention in virtually any appropriately detailed system, structure, or manner.

Figure 1:
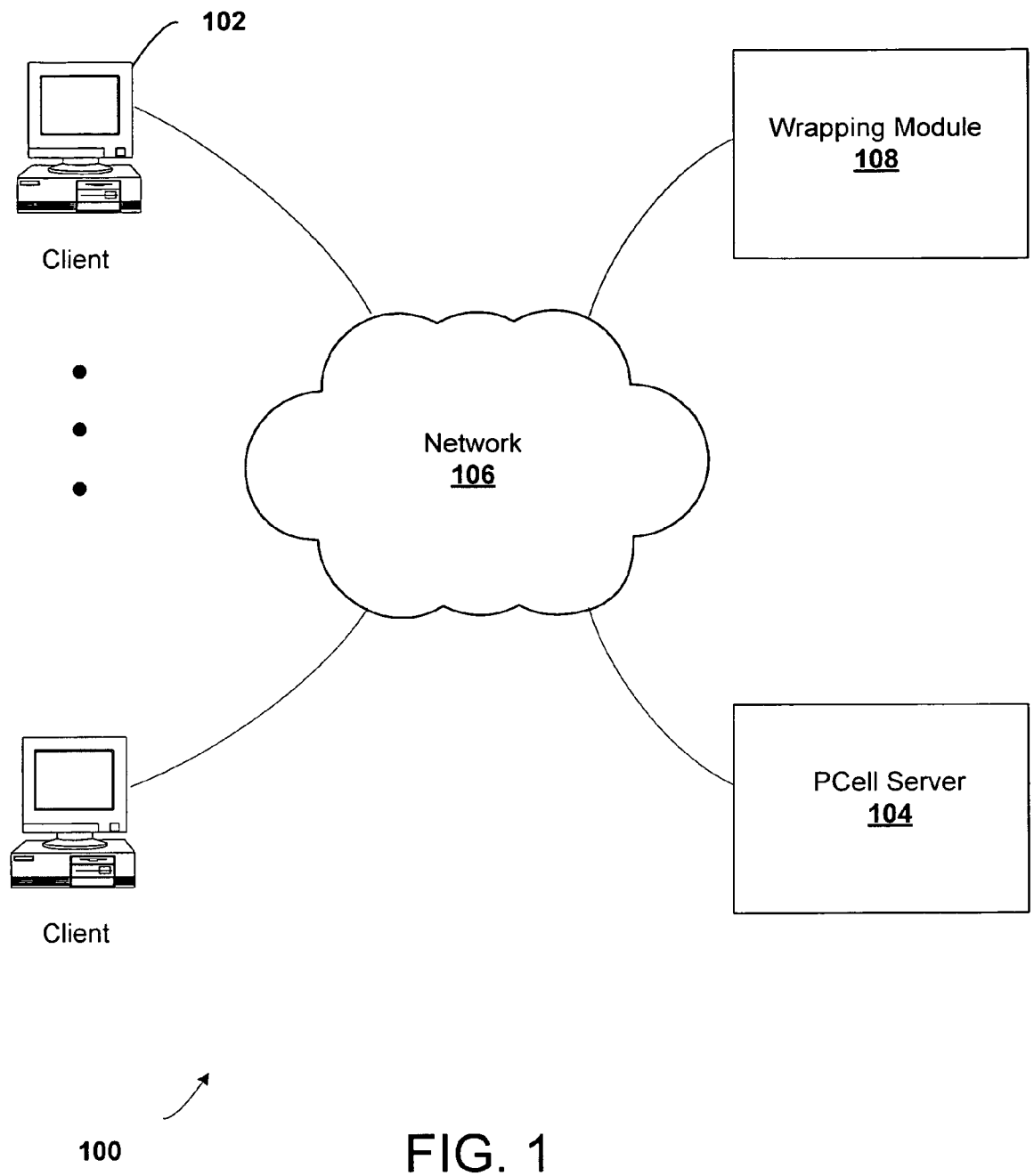
FIG. 1 is a diagram of an integrated circuit design environment, according to various embodiments of the invention.

FIG. 1 is an exemplary diagram of an environment 100 for providing an integrated IC design system. Exemplary embodiments of the present invention comprise one or more clients 102 configured to communicate with a PCell server 104 over a network 106, and a wrapping module 108 configured to transform original PCells into wrapped PCells by adding data to the original PCells. The components illustrated in FIG. 1 may include software, hardware, firmware, or combinations thereof.

The client 102 comprises a computing device associated with a user. The client 102 may comprise a personal computer (e.g., a desktop or a laptop), a workstation, or other computing device. According to exemplary embodiments, the client 102 establishes a layout of an element of an IC device (e.g., a transistor). The client 102 then generates a request for a physical representation of the element in cell format, for example, from the PCell server 104. Subsequently, the physical representation received in response is made accessible to the user, for example, on a display coupled to the client 102. The client 102 is discussed in greater detail in connection with FIG. 2 and FIG. 3. The concept of cells is discussed in greater detail below.

The PCell server 104 may comprise a repository for storing physical representations in cell format. In exemplary embodiments, the PCell server 104 may comprise cells in an open standard database compatible format. In some embodiments, the PCell server 104 may comprise a server proxy engine for evaluating the request for the physical representation in a customized manner. The PCell server 104 is discussed in greater detail in connection with FIG. 4.

The network 106 may comprise any inter-process communications (IPC) setup, for example on the same device as the client 102. The network 106 may comprise any network, such as Internet, local area network (LAN), wide area network (WAN), or any other type of communication network. In the environment 100 comprising two clients 102, for example, the network 106 may be an IPC setup between the two clients 102.

The wrapping module 108 is configured to transform an original PCell (e.g., the PCells in an original vendor-specific PCell library) into a wrapped PCell by adding new PCell-specific data to the original PCell data. The wrapped PCells are evaluated by a proxy PCell evaluator. The wrapping module 108 may be embodied within the client 102, PCell server 104, or other device. The wrapping module and evaluation by proxy are discussed in detail in FIG. 3.

Figure 2:
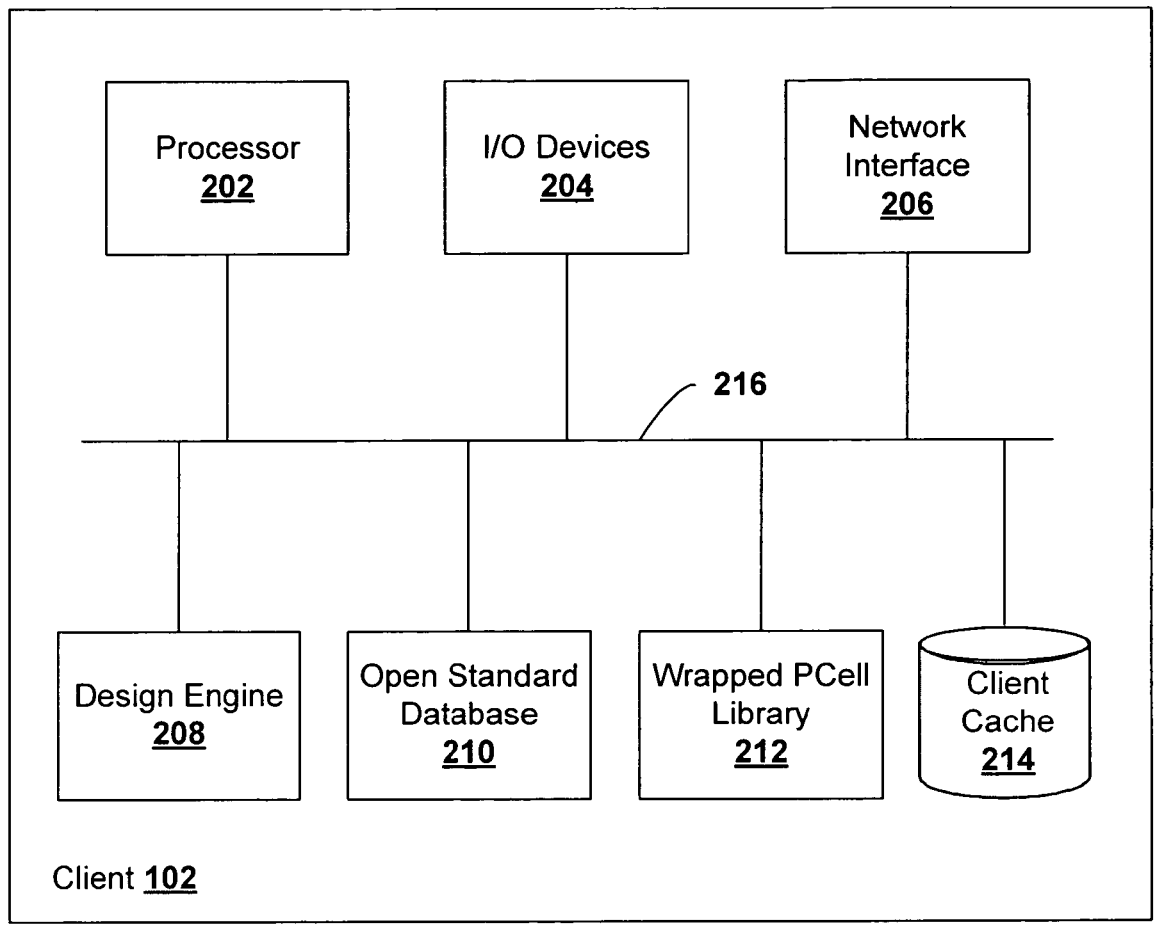
FIG. 2 is an exemplary block diagram of a client.

FIG. 2 is an exemplary block diagram of the client 102. The exemplary client 102 comprises a processor 202, an I/O devices 204, a network interface 206, a design engine 208, an open standard database 210, a wrapped PCell library 212, and a client cache 214. The various components of the client 102 may be coupled with an internal bus 216. The use of the internal bus 216 allows each of the components to transfer data among themselves. The processor 202 may be a Sparc™, a PowerPC™, an X86™, a RISC™, or the like. The I/O devices 204 may comprise a monitor, a relative pointing device (e.g., a mouse), a keyboard, a CDROM drive, or the like.

The network interface 206 is a point of interconnection between the client 102 and the network 106 (e.g., a network card on the computing device of the client 102). In some embodiments, the network interface 206 may interconnect two clients 102. In some embodiments, the network interface 206 is optional. For example, in an embodiment including a stand-alone client 102, the network interface 206 is not required, because the client 102 is not coupled to the network 106.

The design engine 208 may be configured to evaluate the PCell in any EDA vendor's format (i.e., whether proprietary or open standard) and to generate an instantiation of the PCell in an open standard data format such that the evaluation results become accessible to any EDA vendor's user application. The evaluation results may also be referred to as "design data." The design engine 208 is described in more detail in connection with FIG. 3.

The open standard database 210 is configured to store IC design resources compatible with the open standard data format. The term "open standard" as used herein may comprise the OpenAccess standard as promoted by Silicon Integration Initiative, Inc. The term "open standard database" as used herein may comprise the OpenAccess database implementation or another open standard electronic design database implementation compatible with the OpenAccess application programming interface. Open standard and open standard database may further include any similar open standard intended to facilitate interoperability among IC design tools. Interoperability may be facilitated, for example, by seamlessly sharing and exchanging design data. For purposes of proxied evaluation of PCells, the open standard comprises a PCell application programming interface capable of enabling wrapping of PCells.

In general, a "cell" comprises an element of an IC design for which a physical representation (also known as an instance or instantiation) is sought. The term "PCell" as used herein comprises a parameterized cell that requires evaluation in order to generate layout data at a time of instantiation. The PCell is characterized by its association with definitions or other information related to how to evaluate the PCell when instantiated. PCells are distinguished from other cells ("regular cells") which are associated with actual layout or design data. Regular cells involve no evaluation for the generation of layout data when instantiated. Rather, the layout data of regular cells is fixed.

The wrapped PCell library 212 is configured to store PCell definitions and associated design data related to the IC design wrapped by the wrapping module 108 and is compatible with the open standard data format.

In exemplary embodiments, the cells are typically PCells, but may also comprise regular cells compatible with other open standard formats. The wrapped PCell library 212 is configured to store PCells. Although the wrapped PCell library 212 can store regular cells as well, only PCells are capable of being wrapping and, thereafter, to be evaluated by proxy.

The wrapped PCell library 212 is further configured to receive requests for wrapped PCell data from a proxy engine and to communicate the wrapped PCell data to the proxy engine. The proxy engine 308 is described in more detail in connection with FIG. 3.

The client cache 214 is configured to store design data such as the data created by PCell evaluations. In exemplary embodiments of the present invention, the contents of the client cache 214 are saved to disk (e.g., by the client proxy engine 306). When the layout is opened again, the design data created by PCell evaluations need not be recomputed by the design engine 208 but can instead be loaded from the client cache 214. The efficiency improvement in reloading design data from the client cache 214 increases with number and complexity of PCell evaluations that would otherwise need to be recomputed in order to recreate the physical representations of the design data. The time to open an IC design previously saved to disk varies depending on the complexity of PCells and the number of unique PCells instantiations in the IC design. The time to open could decrease by an order of magnitude, for example, from a few minutes where the entire layout needs to be recomputed, to a few seconds where design data are loaded from the client cache 214.

In addition to speeding up the time to open a layout by avoiding costly recreation, caching enables the user create a portable IC design. The portable IC design enables the user to deliver to the third party an IC design that preserves its hierarchy without delivering the original PCells (i.e., an original PCell library). "Hierarchy" in this context refers to levels of designs with instances referring to other PCells, for example recursively. By delivering only the top-level design, the cached design data for lower-level designs, and the wrapped PCell library, without delivering the original PCell evaluator and/or scripts for the original PCells, a designer is able to protect his or her intellectual property from being disclosed to the third party. In addition, the EDA vendor can provide to users pre-wrapped PCells, thereby avoiding disclosure of the intellectual property of the vendor's original PCells. Furthermore, the design thus delivered may be opened by any open standard compatible tool, resulting in cross-vendor portability.

In some embodiments, the client cache 214 comprises a temporary repository. In other embodiments, the client cache 214 is optional. The use of the open standard database 210, the wrapped PCell library 212, and the client cache 214 during the layout process is described in further detail below.

For purposes of illustration, some examples and embodiments discussed herein refer to the design of IC devices using PCell libraries compatible with the OpenAccess format. However, the scope of the present invention and the examples provided are intended to extend to other types of formats and standards. Further, the scope of the present invention is intended to apply to custom IC design as well as to the design of analog and mixed signal ICs and digital ICs. Examples referring to one of these formats, standards, and/or types of IC devices are intended to be applicable to others.

Figure 3:
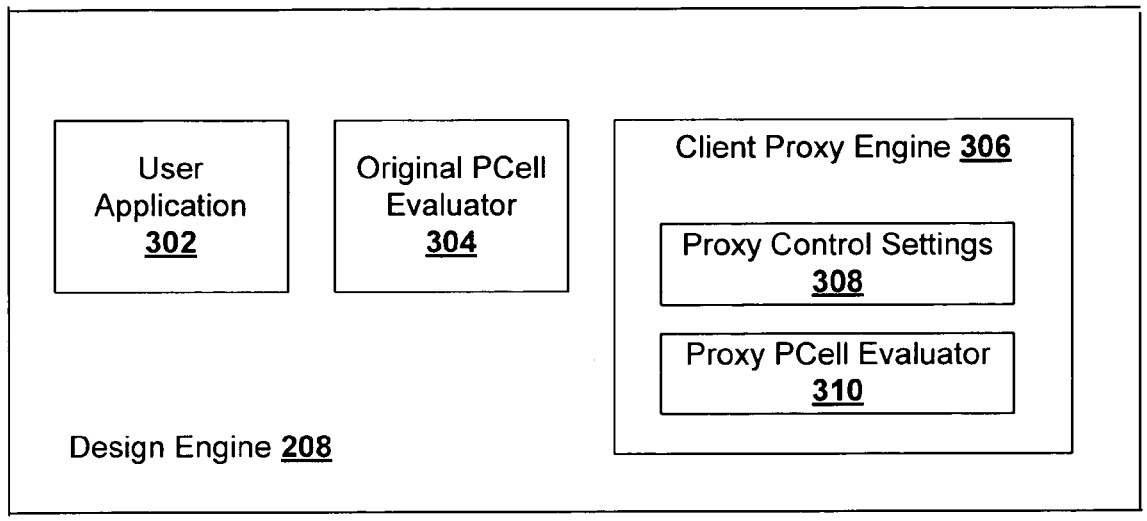
FIG. 3 is an exemplary block diagram of a design engine.

Referring now to FIG. 3, a block diagram of the exemplary design engine 208 is shown. In exemplary embodiments, the design engine 208 comprises a user application 302, an original PCell evaluator 304, and a client proxy engine 306. The exemplary user application 302 is a user application configured to generate requests for evaluation of one or more PCells, typically during the layout stage of the IC design process.

In various embodiments of the present invention, the wrapping module 108 is configured to wrap original PCells by adding data to the original PCell definition. The wrapping module 108 is configured to initially obtain original PCell-specific data associated with the original PCell definition (e.g., by opening the original PCell). The original PCell definition comprises a reference to the original PCell evaluator 304 associated with the original PCell and any data to be used by the original PCell evaluator 304 when evaluating the PCell. The wrapping module 108 then transforms the original PCell into a wrapped PCell by adding new PCell-specific data to the original PCell data.

The added new PCell-specific data comprises a reference to the proxy PCell evaluator 310 such that, when the wrapped PCell is instantiated, the proxy PCell evaluator 310 will be used in lieu of the original PCell evaluator 304. The added new data further comprises any additional data to be used by the proxy PCell evaluator 310, for example, proxy control settings 308 applicable specifically to the particular wrapped PCell. The data of the wrapped PCell thus comprises the added new data as well as the original PCell data. The original PCell data is retained such that the proxy PCell evaluator 310 is able to locate the original PCell evaluator 304 and to convey to the original PCell evaluator 304 the original PCell data.

For open standard database systems with a suitable PCell creation interface (e.g., the OpenAccess with its PCell creation interface), the process of wrapping PCells can be made vendor independent and transparent to users of the IC design system. Transparent in this context means that no changes to the PCell definitions and no restructuring of the PCell library is required in order to wrap PCells or a library of PCells.

The original PCell evaluator 304 is configured to receive the request for evaluation of the original PCell, typically together with parameter values and the identity of the PCell desired, from the user application 302, and to generate the instantiation of the physical, fixed structure of the PCell. In exemplary embodiments, this structure is compatible with the EDA vendor's database format.

In some embodiments, the original PCell evaluator 304 component is optional in the client 102 when the IC design system as a whole comprises at least one original PCell evaluator on at least one client 102 or on the PCell server 104.

The exemplary client proxy engine 306 is configured to evaluate a wrapped PCell such that a customized evaluation flow is performed according to the wrapping. In some embodiments, the customized evaluation involves operations in addition to, or in lieu of, the original PCell evaluation. For example, the operation may comprise pre-processing or post-processing (e.g., counting the number of times a PCell evaluation is requested, or checking the generated design data against one or more constraints). In other embodiments, the customized evaluation is further guided by any additional data associated with the wrapped PCell, for example, by runtime proxy control settings as further described elsewhere herein. The client proxy engine 306 is configured to perform its operations in a manner transparent to the user of the IC design system.

The exemplary client proxy engine 306 comprises a proxy control settings 308 and a proxy PCell evaluator 310. In exemplary embodiments, the proxy control settings 308 is configured to determine settings at runtime (e.g., to determine whether the client cache 214 exists). If the client cache 214 does not exist, the proxy control settings 308 determines whether the client cache 214 should be created and a directory where the cached data are to be saved. Furthermore, if the original PCell evaluator 304 does not exist, the proxy control settings 308 determines whether the PCell server 104 is available. If the PCell server 104 exists, the proxy control settings 308 determine a location of the PCell server 104 (e.g., its network address).

The proxy PCell evaluator 310 is configured to perform the customized evaluation defined by the wrapping of the PCell. In some embodiments, the proxy PCell evaluator 310 is used to save the PCell evaluation results to the client cache 214. As a result, when the layout is opened again after a save to disk operation, the design data need not be recomputed but can instead be loaded from the client cache 214. In some embodiments, the design data are saved to the client cache 214 after each original PCell evaluation. Efficiency improvements in reloading the design data from the client cache 214 increases with the number of PCell evaluations that would otherwise need to be performed in order to recompute the design data.

The proxy PCell evaluator 310 is further configured to verify that the PCell to be evaluated is compatible with the PCell available in the wrapped PCell library 212 on the client 102. For example, the request for evaluation of the PCell may be made with reference to a prior version of PCell as compared to the version of PCell that has been wrapped and is stored in the wrapped PCell library 212. Different versions typically do not arise in IC design systems in which the wrapped PCell library is shared, for example, between two clients 102, or between the client 102 and the PCell server 104. However, in embodiments in which the wrapped PCell library is not shared, different versions may exist between different components of the IC design system.

Destruction of the design data during a save to disk operation is a characteristic of the EDA vendor's database. Proprietary databases as well as the OpenAccess database exhibit this non-persistent characteristic. The designer using either type of database may benefit from preserving the design data in the client cache 214.

In other embodiments, the proxy PCell evaluator 310 is used to delegate the evaluation to another component in the IC design system. For example, in embodiments in which the original PCell evaluator 304 is not available locally to the client 102, and the PCell server 104 is available, the proxy PCell evaluator 310 may delegate the evaluation request to the PCell server 104. In some embodiments, the delegation is communicated to the PCell server 104 via a proprietary data communications and exchange format. The evaluation results received by the proxy PCell evaluator 310 from the PCell server 104 are used as if the original PCell evaluator 304 had been available locally to the client 102.

The ability of the proxy PCell evaluator 310 to delegate to another, functionally equivalent, component of the IC design system enables a first EDA vendor's tool to open an IC design containing instances of PCells proprietary to a second EDA vendor. For example, the designer may need to create a new instance of a PCell with parameter values for which no design data exists (e.g., neither in memory nor in a cache). In such embodiments, the proxy PCell evaluator 310 is configured to delegate the request to evaluate the PCell received from the first EDA vendor's tool to the original PCell evaluator of the second EDA vendor.

In some embodiments, the proxy PCell evaluator 310 is configured to enable the user to deliver his or her proprietary PCell libraries to his or her customers in a wrapped format. The delivery in the wrapped format allows the proxy PCell evaluator 310 to delegate the request to evaluate the PCell to the user's centralized PCell server 104. The delegation can be accomplished without allowing the clients 102 of the user's customers to maintain local client caches 214. The customers' clients 102 have access to the proprietary PCells stored on the PCell server 104. However, the customers' clients 102 have no access to the implementation details of the proprietary PCells, which contain the user's intellectual property. In other embodiments, the proxy PCell evaluator 310 is configured to perform license validation and/or to calculate the cost of using the PCells for business purposes.

In yet other embodiments, the proxy PCell evaluator 310 is configured to perform both caching and delegation. In still other embodiments, the proxy PCell evaluator 310 is configured to perform other types of customization to the evaluation independent of, or in addition to, caching and delegation. For example, the customization may comprise post-processing to check the original evaluation results against a design rule for the purpose of identifying design rule violations.

Figure 4:
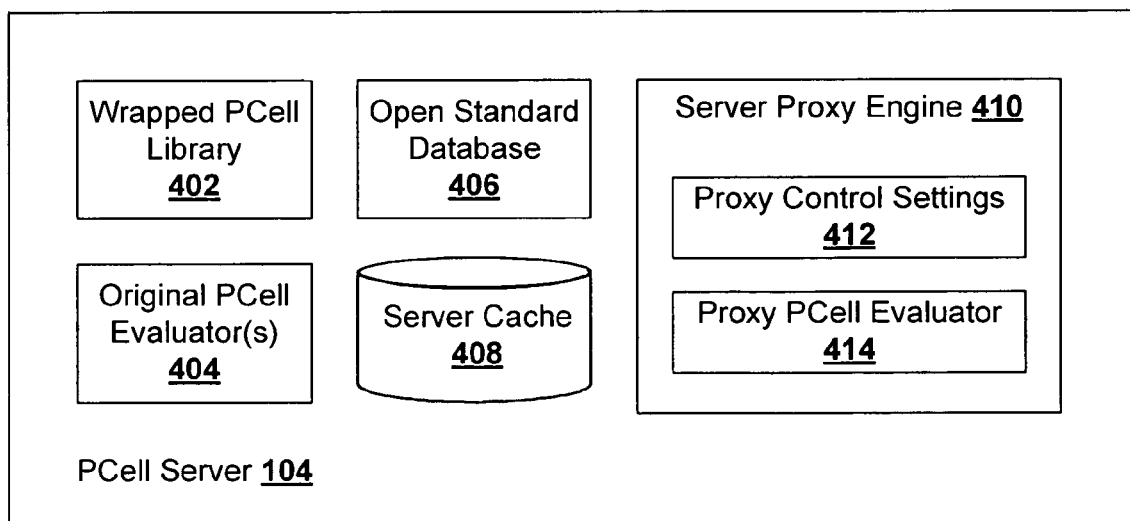
FIG. 4 is an exemplary block diagram of a PCell server.

In some embodiments of the present invention, one or more clients 102 are coupled to the PCell server 104 via the network 106. In these embodiments, the PCell server 104 comprises at least one of the components of a wrapped PCell library 402, an original PCell evaluator 404, an open standard database 406, a server cache 408, or a server proxy engine 410 as illustrated in FIG. 4. In some embodiments comprising multiple clients 102, some efficiency improvements may be achieved by having, for example, an open standard database 404 on the PCell server 104 rather than duplicating databases by having one open standard database 210 on each client 102. Efficiencies may comprise, for example, a reduction in storage capacity required on the clients 102, a reduction in maintenance and backup required on the clients 102, and the like.

Likewise, some efficiencies may be achieved by performing computations in the original PCell evaluator 402 on the PCell server 104 rather than duplicating such computations on multiple clients 102. The functionality of the components at the PCell server 104 is equivalent to the functionality of the corresponding components at the clients 102. For example, some elements of an IC design are likely to recur more often. Computing the evaluation results for the physical representation for such elements once, on the PCell server 104, rather than multiple times on each of the clients 102, results in computational efficiency. Similarly, storing often recurring evaluation results in the server cache 408, accessible to multiple clients 102, will result in some efficiencies compared to duplicating such repositories on multiple clients 102.

Likewise, the server proxy engine 410, comprising proxy control settings 412 and proxy PCell evaluator 414, may exist in addition to, or in lieu of, client proxy engine 306. The server proxy engine 410 may be a necessary component in embodiments of the present invention in which requests for evaluation of PCells can be delegated recursively.

In alternative embodiments, some or all of the components of the PCell server 104 may be duplicated on the clients 102. For example, a particular client 102 may be dedicated to the design of integrated circuits involving highly sensitive business or military information not intended to, or suitable for, being made accessible to users of other clients 102 as part of the PCell server 104.

In exemplary embodiments comprising the wrapped PCell library 402 component, the wrapped PCell library 402 is configured to perform the equivalent function of the wrapped cell library 212 for the one or more clients 102. Similarly, in embodiments comprising the open standard database 406 component, the open standard database 406 is configured to perform the same function as the open standard database 210 for the one or more clients 102 coupled to the PCell server 104 via the network 106. Likewise, the proxy control settings 412 is configured to perform the equivalent functionality of the proxy control settings 308 for the one or more clients 102, and the proxy PCell evaluator 414 is configured to perform the equivalent functionality of the proxy PCell evaluator 310 for the one or more clients 102.

In embodiments comprising the original PCell evaluator 404 component, the original PCell evaluator 404 is configured to store PCell evaluation related data for the one or more IC designs under layout on the one or more clients 102. In some embodiments, the original PCell evaluator 404 is configured to operate in lieu of the original PCell evaluator 304 on the one or more clients 102. In other embodiments, the original PCell evaluator 404 on the PCell server 104 is configured to operate in addition to the one or more original PCell evaluators 304 on the one or more clients 102. In these embodiments, the wrapped PCells may reside in the wrapped PCell library 402 on the PCell server 104 as well as in one or more of the wrapped PCell libraries 206 on the clients 102. In embodiments of the PCell server 104 which comprise the server cache 408 component, the server cache 408 is configured to store data, for example the results from PCell evaluations performed by the original PCell evaluator 404.

In embodiments of the IC design system which comprise the PCell server 104 component, one or more components of the client 102 may be optional so long as a corresponding component is present elsewhere in the IC design system. For example, the open standard database 210 is optional on the client 102 provided that the open standard database 406 is present. Similarly, cached design data may be stored in the server cache 408 in lieu of, or in addition to, being stored in the client cache 214. In some embodiments of the present invention, no cache is present on the PCell server 104 or on any of the client 102, for example, in embodiments in which the benefits of delegation rather than caching are sought. In yet other embodiments of the present invention, the PCell server 104 is not present in an IC design system which comprises a single client 102. In some such embodiments, the entire IC design system resides on a single computing device, for example, on a single personal computer.

Figure 5:
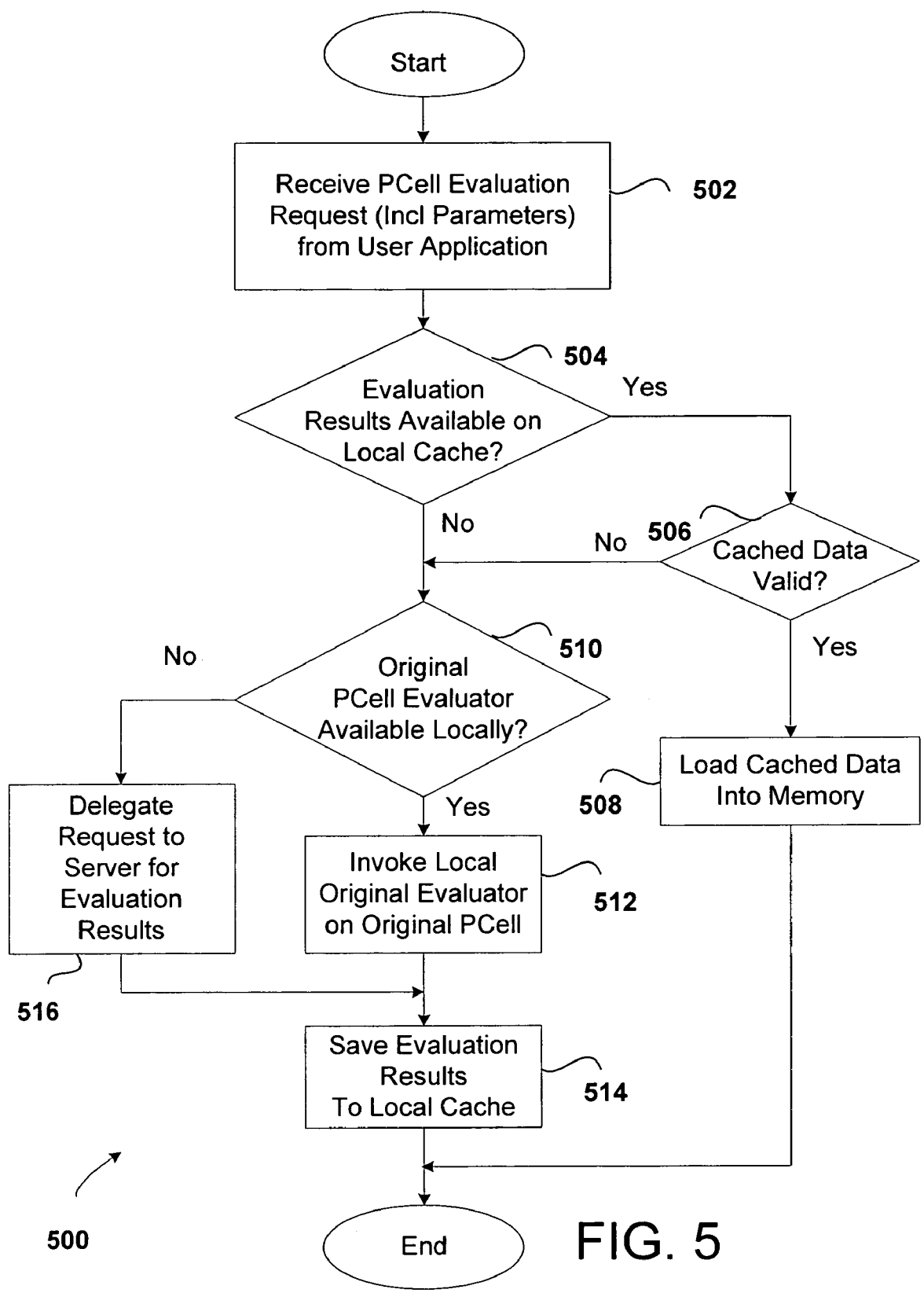
FIG. 5 is a flowchart of an exemplary method for using a proxy engine on a client to evaluate a particular customized evaluation flow.

FIG. 5 illustrates a flowchart of an exemplary method for using a client proxy engine 306 to evaluate a particular customized evaluation flow. More specifically, FIG. 5 illustrates a flowchart of an exemplary method in which the client proxy engine 306 is configured to perform both caching and delegation as part of the customization to the evaluation flow.

According to exemplary embodiments, in step 502, the client proxy engine 306 receives a PCell evaluation request from the user application 302. For example, the request may be to generate the layout for a transistor of specific size. The received request typically includes parameter values. Default parameter values may be used if no parameter values are included.

In step 504, the proxy PCell evaluator 310 determines whether the evaluation results for the received request are available locally in the client cache 214. In some embodiments, the evaluation results are available in the server cache 408 in addition to, or in lieu of, in one or more client caches 214.

If the evaluation results are available, in step 506, the client proxy PCell evaluator 310 determines whether the cached data is valid in step 506. If the cached data is valid, it is loaded into memory in step 508.

The cached data can be invalid if, for example, a conflict exists between two or more different requests for evaluation. This situation can arise if, for example, a file name on the client cache 214 is limited to a maximum number of characters such that two different file names, both exceeding the maximum, are truncated to the same file name. As a result, both requests become mapped to the same truncated file name, or slot, of the client cache 214, creating the conflict.

In embodiments in which caching is performed for speed efficiencies, an invalid cache results in an additional PCell evaluation. In embodiments in which caching is performed for portability of the IC design, the validation in step 506 can be performed by a tool separate from the components of the IC design system illustrated in FIG. 1. The separate tool may be required, because the recipient of the IC design and cache to be delivered (e.g., a third party foundry), may not have access to the original PCell evaluator. The recipient is then unable to recreate missing design data in case of PCell instantiations involving conflicts. The separate tool is used to verify that no conflicts exist in the IC design and cache prior to delivery to a third party.

The separate tool may comprise, for example, a hashing algorithm. Hashing algorithms are known in the prior art. The separate tool can be made accessible to the IC design system by changing proxy control settings 308.

In some embodiments, delegation may be performed recursively. For example, some embodiments may comprise one client 102 and two PCell servers 104. If the proxy PCell evaluator 310 on the client 102 determines that no original PCell evaluator 304 is available, it will delegate the evaluation request to the original PCell evaluator 404 on a first PCell server 104. If the first PCell server 104 determines that it does not have an original PCell evaluator, the proxy PCell evaluator on the first PCell sever 104 will delegate the evaluation request to the original PCell evaluator 404 on a second PCell server 104. The evaluation results from the second PCell server 104 are then sent back to the first PCell server 104 and on to the client 102. The recursive delegation process is performed transparent to the user of the IC design system.

If the evaluation results are not available in the client cache 214 or in the server cache 408, or if no client cache 214 or server cache 408 is present in the IC design system, an original PCell evaluation will be needed in order to complete the received request. In step 510, the proxy PCell evaluator 310 determines whether the client 102 comprises the original PCell evaluator 304. If so, in step 512, the local original PCell evaluator 304 on the client 102 is invoked on the original PCell to generate the evaluation results. If not, in step 516, the proxy PCell evaluator 310 sends the evaluation request to the PCell server 104 to invoke the original PCell evaluator 404 on the PCell server 104 on the original PCell to generate the evaluation results.

In step 514, the evaluation results from the original PCell evaluation are saved to local cache. In some embodiments, saving the evaluation results to local cache results in improved efficiencies, for example, by reducing the time to open an IC design after a save to disk operation has been performed. The efficiency is achieved by reducing the number of evaluation results that need to be recomputed by instead reloading part or all of the evaluation results from the cache.

In some embodiments, the results are saved to one or more client caches 214. In other embodiments, the results are saved, alternatively or additionally, to the server cache 408. If no cache is present in the IC design system, step 514 is omitted.

Figure 6:
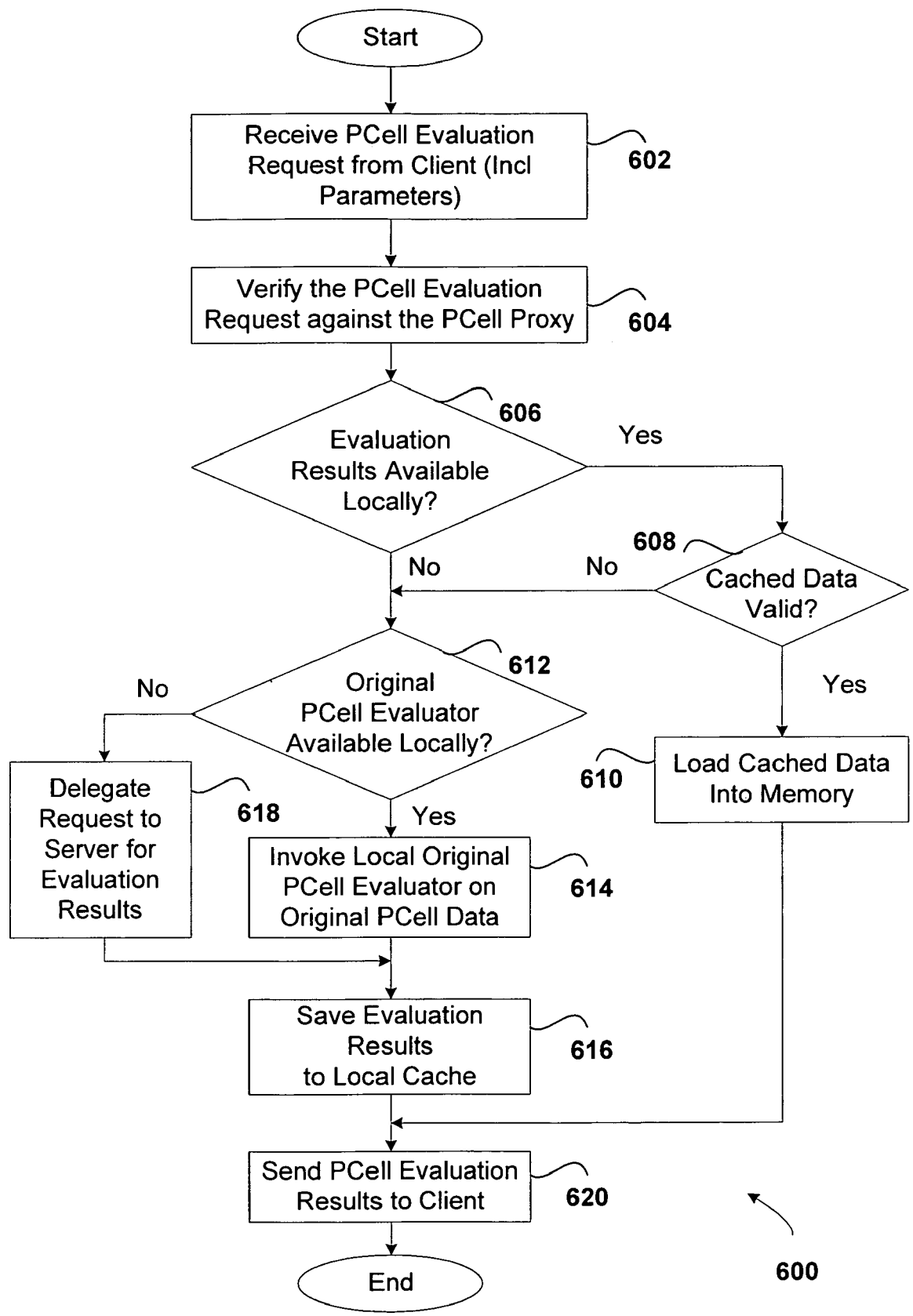
FIG. 6 is a flowchart of an exemplary method for using a proxy engine on a PCell server to evaluate a particular customized evaluation flow.

Referring now to FIG. 6, a flowchart of an exemplary method for using a server proxy engine 410 to evaluate a particular customized evaluation flow is shown. In step 602, the server proxy PCell evaluator 410 receives a PCell evaluation request from the client 102. In step 604, the proxy PCell evaluator 414 verifies that the PCell to be evaluated is compatible with the PCells available in the wrapped PCell library 402 on the PCell server 104. The verification is based on the data added as part of the wrapping of the PCell where a unique identifier is associated with each wrapped PCell.

In the exemplary flow chart, steps 606 through 618 are thereafter performed in an identical fashion as the steps 504 through 516 in FIG. 5. The PCell evaluation results obtained in step 616 (or, if step 616 is optional, e.g., if no cache exists, in step 610, 614, or 618, respectively) are sent to the client 102 in step 620.

The flow chart in FIG. 6 inherently illustrates a characteristic of recursive delegation in exemplary embodiments of the present invention. For example, a request received from the client 102 in step 602 is evaluated by the server proxy engine 410 on a first PCell server 104 in step 504. If no PCell server 104 is available for delegation, an error message is returned to the client 102. If the evaluation results are not available locally (e.g., on the client cache 214, or on the server cache 408 of the first PCell server 104 in step 504 as performed in connection with FIG. 6), the original PCell evaluator is invoked. If the original PCell evaluator is not available locally (e.g., on the client 102, or on the first PCell server 104), the request is delegated to a second PCell server 104 in step 516. The original PCell evaluator on the second PCell server 104 evaluates the request and generated evaluation results in step 516. If the original PCell evaluator is not available on the second PCell server 104, the request is delegated again to a third PCell server 104, where it is evaluated on the original PCell evaluator on the third PCell server 104, if available, and so forth. In this manner, the first PCell server 104 becomes the client with respect to the second PCell server 104, and so forth. The result obtained is recursive delegation of requests for evaluation of PCells.

In embodiments comprising the PCell server 104 component, the evaluation results may be sent back from the PCell server 104 to the client 102 in step 620. For example, when the original PCell evaluator 404 is used to recompute the evaluation results in step 614 or when cached data is retrieved from the server cache 408.

In some embodiments, the IC design system comprises more than one PCell server 104. For example, the proxy control settings 310 may be configured such that a first PCell server 104 is also the client 102 to a second PCell server 104. In such embodiments, the evaluation of cells may be performed in a recursive manner by delegating the request for evaluation more than once.

The present invention has been described above with reference to exemplary embodiments. It will be apparent to those skilled in the art that various modifications may be made and that other embodiments can be used without departing from the broader scope of the present invention. For example, while proxy engines configured to perform caching and/or delegation of evaluation requests of PCells are discussed herein, one of ordinary skill in the art would understand that systems and methods of configuring proxy engines to perform other types of customized evaluation flow may be accomplished in an equivalent approach as well. Furthermore, the recursive nature of delegation in embodiments comprising multiple servers may be extended to more than two hierarchies. Therefore, these and other variations upon the exemplary embodiments are intended to be covered by the present invention.

What is claimed is:

1. A system for designing an integrated circuit, the system comprising:
    a wrapping module configured to add data to an original vendor specific PCell to transform the original PCell to a wrapped PCell in an open standard compatible format, wherein the wrapped PCell is not vendor specific; and
    an evaluator configured to evaluate the wrapped PCell to generate an evaluation result based on a request from a user application, the evaluation result comprising layout data in the open standard compatible format.

2. The system of claim 1, wherein the evaluator is an original PCell evaluator.

3. The system of claim 1, wherein the evaluator is a proxy PCell evaluator.

4. The system of claim 3, further comprising a proxy control settings component configured to determine system settings at runtime.

5. The system of claim 3, wherein the added data comprises data specific to the proxy PCell evaluator, and the proxy PCell evaluator is configured to respond to the proxy specific data.

6. The system of claim 1, further comprising a cache configured to store the evaluation result.

7. The system of claim 6, further comprising a server configured to house the cache.

8. The system of claim 1, wherein the open standard compatible format is the OpenAccess standard.

9. The system of claim 1, further comprising a server configured to house the evaluator.

10. The system of claim 1, further comprising a file library configured to store the PCells with the added data.

11. The system of claim 10, further comprising a server configured to house the file library.

12. A method for designing an integrated circuit, comprising:
    executing a wrapping module stored in memory to add data to an original vendor specific PCell to transform the original PCell to a wrapped PCell in an open standard compatible format, wherein the wrapped PCell is not vendor specific;
    receiving, at a proxy engine, a request from a user application to evaluate the wrapped PCell; and
    evaluating the wrapped PCell based on the request to generate an evaluation result comprising layout data in the open standard compatible format.

13. The method of claim 12, wherein the open standard compatible format is the OpenAccess standard.

14. The method of claim 12, further comprising storing the generated evaluation results to a cache.

15. The method of claim 14, wherein the storing is performed for the purpose of avoiding recomputation of the evaluation results.

16. The method of claim 12, wherein the receiving of the request comprises delegating the request to an evaluator configured to reside on a server.

17. The method of claim 12, wherein the evaluating of the request comprises determining whether a valid cache exists.

18. The method of claim 17, wherein the evaluating of the request further comprises accessing the valid cache to retrieve open standard compatible data from the valid cache if the valid cache exists.

19. The method of claim 17, wherein the evaluating of the request further comprises storing the evaluation result to the cache.

20. A machine readable storage medium having embodied thereon a program, the program being executable by a machine to perform a method for designing an integrated circuit, the method comprising:
    adding data to an original vendor specific PCell to transform the original PCell to a wrapped PCell in an open standard compatible format, wherein the wrapped PCell is not vendor specific;
    receiving, at a proxy engine, a request from a user application to evaluate the wrapped PCell; and
    evaluating the wrapped PCell based on the request to generate an evaluation result comprising layout data in the open standard compatible format.

* * * * *